United States Patent
Moser et al.

(10) Patent No.: US 9,909,568 B2
(45) Date of Patent: Mar. 6, 2018

(54) DEVICE FOR DETECTING CRITICAL STATES OF A SURFACE

(71) Applicants: Michael Moser, Graz (AT); Hubert Zangl, Graz (AT)

(72) Inventors: Michael Moser, Graz (AT); Hubert Zangl, Graz (AT)

(73) Assignee: Eologix Sensor Technology GMBH (AT)

( * ) Notice: Subject to any disclaimer, the term of this patent is extended or adjusted under 35 U.S.C. 154(b) by 306 days.

(21) Appl. No.: 14/386,638

(22) PCT Filed: Mar. 18, 2013

(86) PCT No.: PCT/AT2013/050066
§ 371 (c)(1),
(2) Date: Sep. 19, 2014

(87) PCT Pub. No.: WO2013/138832
PCT Pub. Date: Sep. 26, 2013

(65) Prior Publication Data
US 2015/0035548 A1   Feb. 5, 2015

(30) Foreign Application Priority Data
Mar. 19, 2012 (AT) .................................. A 329/2012

(51) Int. Cl.
*F03D 11/00* (2006.01)
*B64D 15/20* (2006.01)
(Continued)

(52) U.S. Cl.
CPC .......... *F03D 11/0025* (2013.01); *B64D 15/20* (2013.01); *B64D 15/22* (2013.01);
(Continued)

(58) Field of Classification Search
CPC . F03D 11/0025; F03D 80/40; G01R 27/2605; B64D 15/22; B64D 15/20; G08B 19/02; Y02E 10/722
(Continued)

(56) References Cited

U.S. PATENT DOCUMENTS

| | | | |
|---|---|---|---|
| 5,177,662 A | 1/1993 | Thoma | |
| 5,398,547 A * | 3/1995 | Gerardi | B64D 15/20 244/134 F |

(Continued)

FOREIGN PATENT DOCUMENTS

| | | |
|---|---|---|
| CN | 101285673 A | 10/2008 |
| DE | 20206704 U1 | 9/2002 |

(Continued)

OTHER PUBLICATIONS

European Patent Office, The International Preliminary Report on Patentability of the International Searching Authority, for International Application No. PCT/AT2013/050066, dated Sep. 16, 2013.
(Continued)

*Primary Examiner* — Melissa Koval
*Assistant Examiner* — Courtney McDonnough
(74) *Attorney, Agent, or Firm* — Design IP

(57) ABSTRACT

A device for detecting critical states of a surface, in which at least one hermetically sealed sensor for detecting critical states of a surface, one system for energy supply and one device for data transfer with an at least partially flexible, thin carrier plate are mechanically connected, and said carrier plate is arranged on the surface to be observed.

6 Claims, 3 Drawing Sheets

Figure 1:
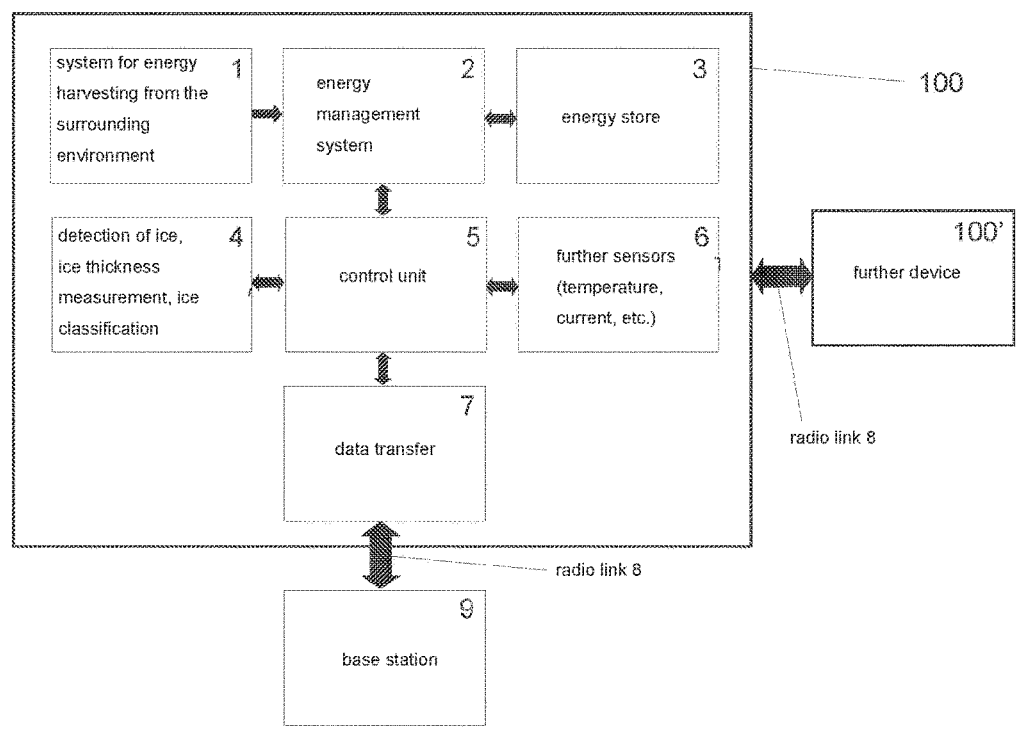

(51) Int. Cl.
    *B64D 15/22*     (2006.01)
    *G01R 27/26*     (2006.01)
    *F03D 80/40*     (2016.01)
    *G08B 19/02*     (2006.01)

(52) U.S. Cl.
    CPC ......... *F03D 80/40* (2016.05); *G01R 27/2605* (2013.01); *G08B 19/02* (2013.01); *Y02E 10/72* (2013.01)

(58) Field of Classification Search
    USPC ........................................................ 324/658
    See application file for complete search history.

(56) References Cited

U.S. PATENT DOCUMENTS

| | | | | |
|---|---|---|---|---|
| 2010/0274447 | A1* | 10/2010 | Stumpf | G01D 1/00 701/36 |
| 2011/0012583 | A1* | 1/2011 | Hyde | H02J 3/16 323/355 |
| 2012/0221111 | A1* | 8/2012 | Burkhead, Jr. | A61F 2/4081 623/19.11 |
| 2013/0078093 | A1* | 3/2013 | Miranda | F03D 7/0224 416/1 |

FOREIGN PATENT DOCUMENTS

| | | |
|---|---|---|
| DE | 102005017716 A1 | 10/2006 |
| FR | 2750494 A1 | 1/1998 |
| JP | 2007181278 A | 7/2007 |
| WO | 2007138450 A1 | 12/2007 |
| WO | WO2011117246 * | 9/2011 ........... F03D 7/0224 416/1 |

OTHER PUBLICATIONS

European Patent Office, The International Search Report of the International Searching Authority, for International Application No. PCT/AT2013/050066, dated Sep. 16, 2013.

\* cited by examiner

DEVICE FOR DETECTING CRITICAL STATES OF A SURFACE

TECHNICAL FIELD

The identification of ice formation on surface areas (also surfaces), such as on the rotor blades of wind turbines, can contribute significantly to the observance of safe operating conditions. In the field of wind turbines, a coating of ice causes a lower energy output and higher mechanical stress of the system and at the same time poses the risk of ice shedding (a risk both for people and for material goods). Even thin layers cause relevant output losses due to the turbulent flow at the surface caused by greater surface roughness. Due to increased vibrations and imbalance, thicker layers can lead to damage on the machine, and damage can be caused in the case of shedding. At locations that are at risk, it is of interest to operators of wind turbines to identify the degree of icing of the rotor blades to the best possible extent in order to switch off the wind turbine in good time before damage occurs, or else to selectively activate an electric heating of the rotor blades where provided.

However, ice formation is also a relevant phenomenon in other areas, such as roads, aircraft wings or antennas, and the early identification and elimination of ice formation by suitable measures facilitates fault-free operation.

PRIOR ART

Current commercial systems for detection of icing are typically complex measuring devices and, due to the overall size thereof, are fixedly mounted in the environment of wind turbines and, due to design, typically require a power connection (for example optical and ultrasound-based systems). It is known in expert groups that, for example in the case of wind turbines, the icing behaviour may differ significantly, at the location of the nacelle and at the rotor blades (for example due to the higher wind speed resulting from the rotation). Further systems have therefore been developed, which examine the icing behaviour of the rotor blades, for example by monitoring the state of the rotor blade by means of natural frequency analysis. This system has the disadvantage that not only ice coating may modify the natural frequencies. Furthermore, the detection threshold is relatively high (approximately 4% weight change) and no localisation of the ice layer is possible. Furthermore, a system is known that uses an optical ice detection principle in which optical fibres are guided from inside to the surface of the rotor blade (DE 102005017716 A1). This requires the installation of a complex measuring device in the rotor blade and therefore involves a high installation outlay as well as damage to the surface and allows the measurement only at few points per rotor blade.

Methods for detecting moisture or air moisture by absorption on a porous substrate and evaluation of a complex impedance are described for example in FR 2750494 A1 and U.S. Pat. No. 5,177,662. However, these methods are, by principle, unable to detect the presence of ice or a layer thickness, since the method based on absorption presupposes that moisture can penetrate inside the sensor.

By contrast, methods for ice detection that are based on the measurement of the electrical capacitance or impedance are known (for example U.S. Pat. No. 5,398,547). These methods are suitable particularly for a planar design with low overall height.

DE 102005017716 uses the wireless transfer of signals over a transfer path to a receiver as measurement principle for the detection of deposits as obstacles in an optical transfer path as a method for ice detection on the surface of a rotor blade.

OBJECT OF THE INVENTION

The object is as follows: to create a device for detecting critical surface states, wherein the surface areas particularly at risk typically are not flat (planar) (for example, in the case of aircraft, the rotor blades, high-voltage insulators or antennas). The surface area shape or nature thereof may not be changed by the sensor or may not be changed significantly thereby, for example so as not to alter the behaviour in terms of icing or so as to alter said behaviour only to a minimal extent. The aerodynamics may not be influenced by the device or may only be influenced to a small extent. Within the context of the invention, ice is understood to include all types of frozen water, including in mixture with liquid water. Where applicable, a classification of the ice type or the identification of situations in which ice is reliably eliminated from the surface may also be of interest. Within the context of the invention, water also includes mixtures of water and impurities of the surface.

Within the context of the invention, the following scenarios in particular are to be understood as critical surface states: water and/or ice and/or mixtures thereof on surfaces (for example rotor blades) of wind turbine systems, ice and/or water and/or impurities on high-voltage insulators. Here, one objective of the invention is to detect developing critical states, such that countermeasures can be taken within a time window in which these critical states can still be overcome.

The present invention achieves the object inter alia in that the device, which contains a device for the detection of ice and/or water, for power supply and for data transfer, is configured so as to be mechanically flexible at least in part, and therefore an adaptation to surface areas that are not flat is possible. The device can be hermetically sealed, that is to say no water of air moisture can penetrate inside the sensor; in particular the interface to the surrounding environment is in no way porous. Due to the integration in a unit and the geometric shape (inter alia due to the low overall height in relation to the length and width), a first-time, but also subsequent fitting of the device on a surface area to be detected are possible in a simple manner and without great changes to the surface area. The detected and evaluated data can be transferred wirelessly or in a wired manner to a further device or to a base station, wherein this further device or base station does not necessarily have to be located in the rotor blade and also does not necessarily have to form a mechanical unit with transmitter and receiver.

Further details concerning embodiments and advantages of the present invention are specified below.

The fitting on surfaces that are not flat requires a flexible embodiment of all large-area component parts, in particular an at least partially flexible carrier plate, which for example is formed from two flexible circuit boards, which at the same time may constitute the outer skin, with filler (for example polymer potting) arranged therebetween, whereby a mechanical connection of all components is ensured.

A small thickness of the individual components and small dimensions of rigid component parts are also necessary. The overall thickness lies in the low one-digit millimeter range;

thicknesses of less than 5 mm are advantageous and allow a ratio between the larger side length and the thickness of the device greater than 10.

The sensor for ice detection and/or ice thickness measurement and/or ice classification can be formed for example as a capacitive sensor. A capacitive sensor for ice detection and/or ice thickness measurement consists of a number of electrodes made of conductive structures, which for example can be applied to a flexible, non-porous, ideally hermetically sealing carrier material (that is to say low water absorption/low water permeability of the carrier material), and an evaluation unit, which measures capacitances between electrodes arranged in a largely planar manner and, from this, delivers back a value for detection and/or thickness. The material of the interface between sensor and outside world is likewise to seal off hermetically to a large extent, that is to say the material practically has no permeability or absorption capability for water or steam.

Other sensors contained in the device may measure brightness, vibrations, temperature and/or electric currents, for example. Here, leakage currents in particular (direct and alternating currents) along insulating surfaces, such as high-voltage insulators, on which the device can be fitted, are of interest.

The device can be mounted by adhesion on a surface to be observed (with or without application of further protective layers over the device) or by embedment for example in outer layers of a rotor blade during the production process. There is thus no need for any mechanical interventions (drilled holes, slots, recesses) in the surface to be observed.

For example, the adhesion can be provided by self-adhering films (above or below the device), spray-on adhesive, or liquid adhesives. In a preferred embodiment, an adhesive is already applied to the device during the production process and is covered by a protective film before mounting, such that, when mounting, the protective film merely has to be removed, and the device can be fitted directly to the surface to be observed.

A typical surface treatment (provided not electrically conductive or only slightly electrically conductive) can also be applied above the device, and therefore the original surface nature is retained.

The electrical energy necessary for operation can be recovered from the surrounding environment: for example, flexible solar cells based on GaAs or amorphous silicon can be used for this purpose. Furthermore, energy harvesting from heat (thermoelectric generator) or from vibrations of the surface can be used. These are also technologies that can be implemented with low overall height and/or in a largely flexible manner.

The electrical energy necessary for operation is stored temporarily in an energy store. These energy stores, which are typically rechargeable, can also be provided in flexible embodiment. For example, these may be accumulators or capacitors (also referred to as supercaps, etc.). Furthermore, a (flexible) primary cell (battery) can also be used.

The data transfer of the detected measured data can be implemented advantageously wirelessly (that is to say for example via optical transfer paths or by radio) so as to also do away with connections for the data transfer in addition to the connection for power supply; there is thus no need for any wiring. In this case, the device can be completely hermetically sealed, that is to say no substance (for example water or air moisture) can penetrate inside the device. This increases the robustness of the system.

A number of such devices may optionally communicate with one another, on the one hand so as to limit the path to be traveled by the data transfer by radio (and therefore so as to limit the energy demand) and on the other hand so as to limit the reliability and the statistical quality of the measured data.

A possible application of such devices is ice detection and/or ice thickness measurement on the surface of rotor blades of wind turbines. Here, the device may also be used to control devices for defrosting the surfaces of rotor blades (for example warm air fans, surface heaters). The low weight, the low overall height and the longevity of the device are of particular use in this case. Here, the device can be integrated and commonly applied for example in a surface heater, whereby the device can form a mechanical unit together with the device for defrosting. Here, there is the possibility to use the heat flow from the heater into the surrounding environment for thermoelectric energy harvesting. Furthermore, there is the possibility to use conductive parts of the heater as electrodes for ice detection or ice thickness measurement (capacitive ice sensor), whereby the device can also electrically form a unit together with the device for defrosting. In certain circumstances, the device can also be fitted on the inner side of the rotor blade.

The invention relates to a device for the detection and thickness measurement of ice and water on surfaces and is characterised in that the assemblies for energy harvesting from the surrounding environment, energy storage, data processing and wireless data transfer are already contained in the device, wherein the overall device is thin and flexible. The device can thus be fitted, even subsequently, into the object to be equipped with the device, without relatively great mechanical adjustments. The individual devices optionally can communicate not only with a base station, but also with one another, but operate independently of one another.

The present invention is constituted as follows: a device for detecting critical surface states (for example quantifying ice and water on surfaces), wherein all assemblies for energy supply and data processing as well as data transfer are contained in the device and the device is also thin (overall height less than 5 mm or ration between the greater side length and the thickness >10) and is flexible (bendy) at least in part.

LIST OF THE DRAWINGS

Figure 2:
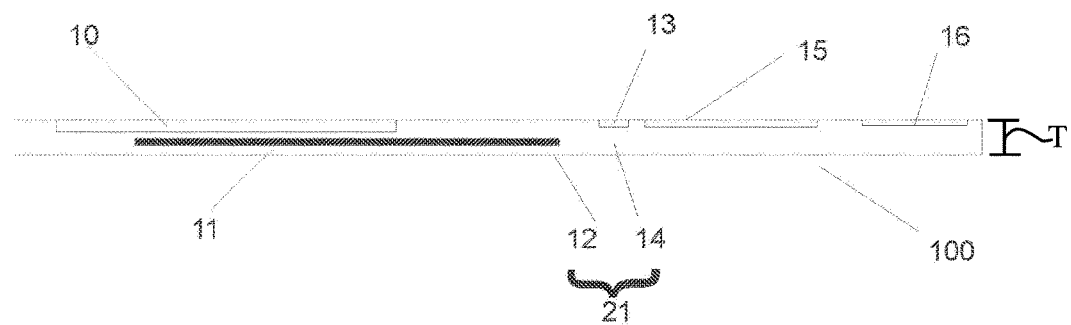
Figure 3:
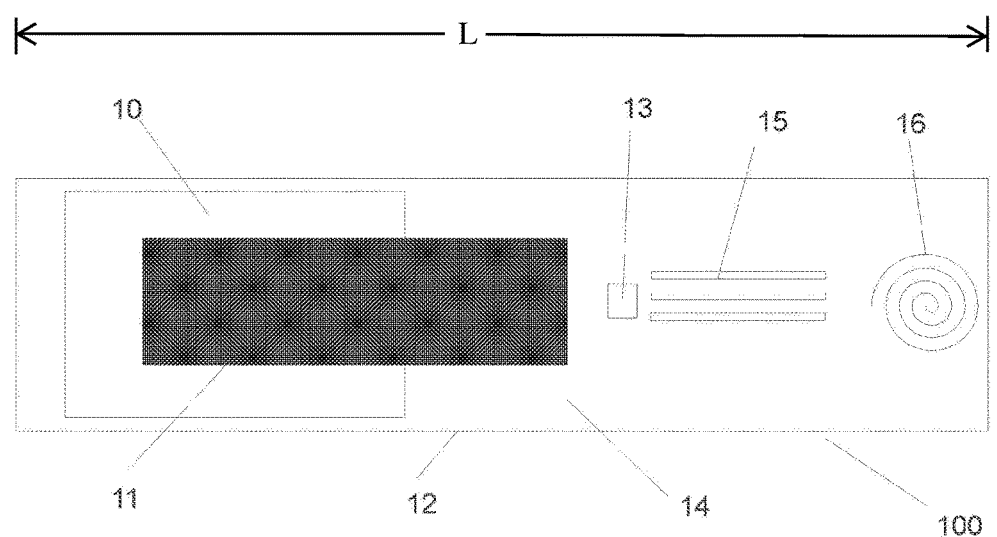

The invention will be explained in greater detail on the basis of an exemplary embodiment according to the drawings, wherein FIG. 1 shows an exemplary block diagram of the device, FIG. 2 shows an exemplary embodiment of the device in profile, FIG. 3 shows a plan view of an exemplary embodiment of the device, and FIG. 4 by way of example shows a rotor blade with possible assembly locations for the device.

Figure 5:
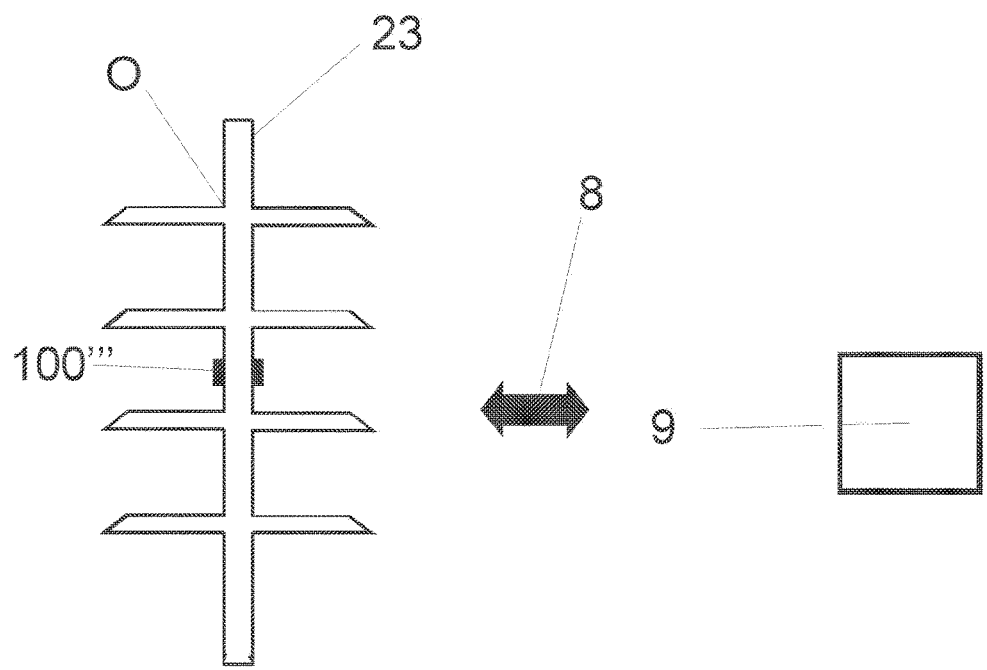

FIG. 5 by way of example shows the assembly of the device on an electric insulator.

DETAILED DESCRIPTION WITH USE OF THE REFERENCE SIGNS IN THE DRAWING

As illustrated in FIG. 1, the device 100, besides a sensor for ice detection and/or ice thickness measurement and/or ice classification 4, may also contain a system for energy harvesting from the surrounding environment 1 (for example from solar radiation, heat, vibrations or leakage currents, electric/magnetic/electromagnetic field). These energy sources typically are not available continuously, as a result of which the energy can be stored temporarily in an energy store 3. Both assemblies are optionally flexible and thin. The regulation is performed by an energy management system 2.

A control unit 5 (for example a microprocessor) is supplied with electrical energy from the energy store 3 or the system for energy harvesting from the surrounding environment 1 and detects measured data of the sensor for ice detection and/or ice thickness measurement and/or ice classification 4. This data can be processed with further measured data from further sensors 6 (for example temperature, current) and is forwarded via a device for data transfer 7, for example wirelessly via a radio link 8, to a further device 100' or a base station 9. Depending on the location and ambient conditions, different devices can be provided for energy harvesting and storage (even a number of systems in a device 100).

FIGS. 2 and 3 show the exemplary schematic structure of the device: a rigid or flexible solar cell 10 lies on or beneath a surface area to be observed and is separated from the surrounding environment by an at least partial light-permeable protective layer. A flexible battery 11 is located within the device 100, which is surrounded by an outer skin 12 (for example a flexible circuit board). The entire interior is filled with a (optionally reinforced) filler 14 (for example a polymer). The outer skin 12, which for example can be formed as a flexible circuit board, forms a mechanical unit together with the filler 14, said unit having the function of the flexible carrier plate 21. Further devices, for example electronic components and integrated modules 13 for data processing, measurement and data transfer, are also arranged within the device 100. The electrodes for ice detection or ice thickness measurement 15 are located beneath the surface area of the device 100 to be observed. The radio antenna 16 is also integrated in the device 100 and may also be arranged beneath the surface O to be observed.

Due to the described features, the device 100 can be hermetically sealed (completely electrically insulated) where applicable, whereby a particularly long, unrestricted service life can be provided. Furthermore, the entire device 100 is thin (overall height less than 5 mm or ratio between greatest side length (L) and thickness (T) greater than 10) and flexible (bendy). The flexible embodiment of large-area, thin component parts with simultaneous use of a flexible carrier material, the arranged of the components relative to one another and small dimensions of rigid components contribute substantially to the flexibility of the device 100.

Figure 4:
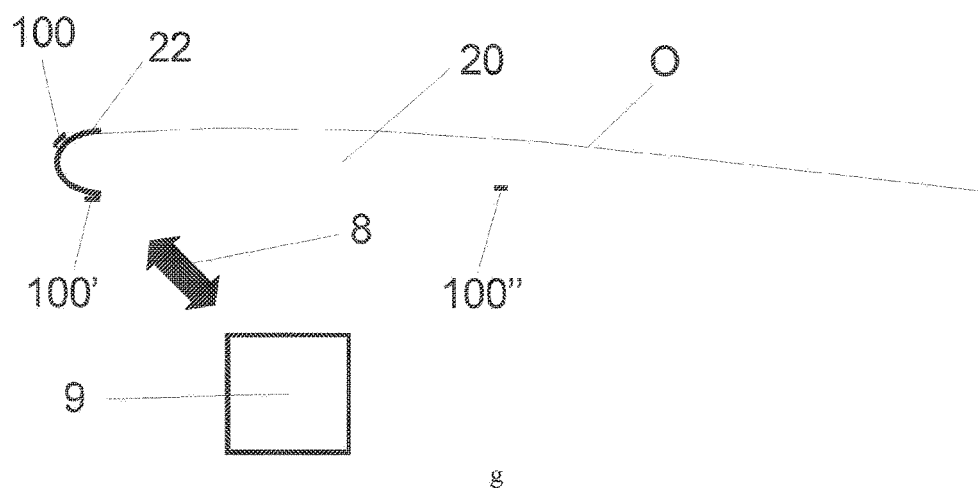

FIG. 4 shows three of many possible mounting positions of the device 100 on a rotor blade 10 of a wind turbine: device 100 and device 100; on the leading edge of the rotor blade 20 are positioned in a manner much more relevant than device 100", since, according to experience, icing starts at the leading edge and only this area is also equipped with a device for defrosting 22, depending on the manufacturer. The curvature of the surface O of the rotor blade 20 is typically particularly strongly pronounced precisely at these positions, which necessitates an at least partially flexible device 100 for the measurement. At the same time, aerodynamic adjustments are critical precisely at the leading edge. A fastening type with minimal overall height requirements (adhesion or integration by lamination) and a low overall height of the device 100 is therefore necessary. Protective layers over the device 100 are unproblematic, provided said protective layers are non-conductive and transparent where necessary. In addition, due to the use of similar materials and comparable overall heights, the device 100 can be integrated for example in a surface heater in such a way that a common assembly or the common use of conductive structures is possible.

The detected measured data is forwarded, for example by radio in a sensor network, to a further device 100' or device 100" for further transfer or is transferred directly to a base station 9 for evaluating and/or for controlling a device for defrosting 22. Here, the embodiment as a sensor network may be advantageous in order to reduce the path to be traveled by the radio transfer (and therefore in order to reduce the energy demand); on the other hand, a number of measurement points are expedient in order to ensure the redundancy of the system and in order to ensure the high quality of the detected values.

FIG. 5 shows one of many possible mounting positions of the device 100: the fitting of the device 100''' to the surface O of an insulator 23 of high-voltage transfer devices (for example overhead line mast, transformer bushing) allows the measurement, with suitable embodiment (for example annular, fitting at assembly position 24), of undesirable leakage currents along such surfaces by means of contacting or contactless methods for current measurement (for example Rogowski coil, fluxgate sensor, shunt resistor).

The invention claimed is:

1. A device for detecting critical states on a surface of a component part, characterised by
an at least partially flexible carrier plate, which can be fastened to the surface, the at least partially flexible carrier plate having an interior that is filled with a filler, wherein the at least partially flexible carrier plate and the filler is mechanically integrated into a unit, together with the following components:
at least one sensor for detecting critical states of the surface;
an at least partially flexible electrical energy store;
a device for electrical energy harvesting, said device comprising a solar cell; and
a control unit for detecting and processing the sensor data and also a data transfer unit for wireless data transfer,
wherein the device is hermetically sealed, and
wherein a thickness of the device is less than 5 mm and a ratio of between a larger side length and the thickness of the device is greater than 10.

2. The device according to claim 1, characterised in that the device can be adhered to the surface.

3. The device according to claim 1, characterised in that the device is integrated beneath the surface into the component part.

4. The device according to claim 1, characterised in that the sensor is a capacitive sensor for detecting icing with a number of electrodes made of conductive structures.

5. The device according to claim 1, characterised in that the sensor can be fastened to the surface of a component part, which has a defrosting appliance for defrosting the surface, wherein the device is used to control the defrosting appliance.

6. The device according to claim 1, characterised in that the sensor is configured to measure leakage currents at the surface of an insulator.

* * * * *